(12) United States Patent
Tsai et al.

(10) Patent No.: US 8,867,279 B2
(45) Date of Patent: Oct. 21, 2014

(54) FLASH MEMORY APPARATUS WITH REFERENCE WORD LINES

(75) Inventors: Yu-Hsiung Tsai, Hsinchu (TW); Wei-Wu Liao, Hsinchu (TW)

(73) Assignee: eMemory Technology Inc., Hsinchu (TW)

( * ) Notice: Subject to any disclaimer, the term of this patent is extended or adjusted under 35 U.S.C. 154(b) by 219 days.

(21) Appl. No.: 13/530,083

(22) Filed: Jun. 21, 2012

(65) Prior Publication Data

US 2013/0343126 A1 Dec. 26, 2013

(51) Int. Cl.
*G11C 16/04* (2006.01)

(52) U.S. Cl.
USPC .............. 365/185.2; 365/185.11; 365/210.1

(58) Field of Classification Search
CPC ........... G11C 16/04; G11C 7/14; G11C 16/28
USPC ................. 365/185.11, 185.17, 185.2, 210.1
See application file for complete search history.

(56) References Cited

U.S. PATENT DOCUMENTS

| | | | |
|---|---|---|---|
| 5,596,527 A | 1/1997 | Tomioka et al. | |
| 6,665,213 B1 * | 12/2003 | Michael et al. | 365/185.2 |
| 7,263,004 B2 * | 8/2007 | Chen | 365/185.25 |
| 7,324,374 B2 | 1/2008 | Shieh et al. | |
| 8,018,773 B2 | 9/2011 | Tran et al. | |
| 2003/0156478 A1 * | 8/2003 | Maruyama et al. | 365/200 |
| 2005/0047234 A1 * | 3/2005 | Kamata | 365/205 |
| 2007/0230263 A1 * | 10/2007 | Sakakibara | 365/210 |

FOREIGN PATENT DOCUMENTS

| | | |
|---|---|---|
| JP | H05-250889 | 9/1993 |
| JP | 2002-367390 | 12/2002 |
| JP | 2005-078698 | 3/2005 |
| JP | 2005-209245 | 8/2005 |

* cited by examiner

*Primary Examiner* — Douglas King
(74) *Attorney, Agent, or Firm* — Jianq Chyun IP Office (57) ABSTRACT

The invention provides a flash memory apparatus including at least one flash memory array block and a sense amplifying module. The flash memory array block comprises N storage columns, N reference word-line cell units and a reference storage column, wherein N is a positive integer. Each of the reference word-line cell units disposed in each of the storage columns, wherein, the reference word-line cell units further coupled to a reference word line and a dummy word line. The reference storage column includes a plurality of reference bit-line cells, the reference word line and the dummy word line, one of the reference bit-line cells which coupled to the reference word line is coupled to a reference bit line. The sense amplifying module compares currents from one of the bit lines and the corresponding reference bit line to generate at least one sensing result.

21 Claims, 6 Drawing Sheets

FLASH MEMORY APPARATUS WITH REFERENCE WORD LINES

BACKGROUND OF THE INVENTION

1. Field of Invention

The present invention generally relates to a flash memory apparatus, and more particularly to a flash memory apparatus with reference word lines.

2. Description of Prior Art

Figure 1:
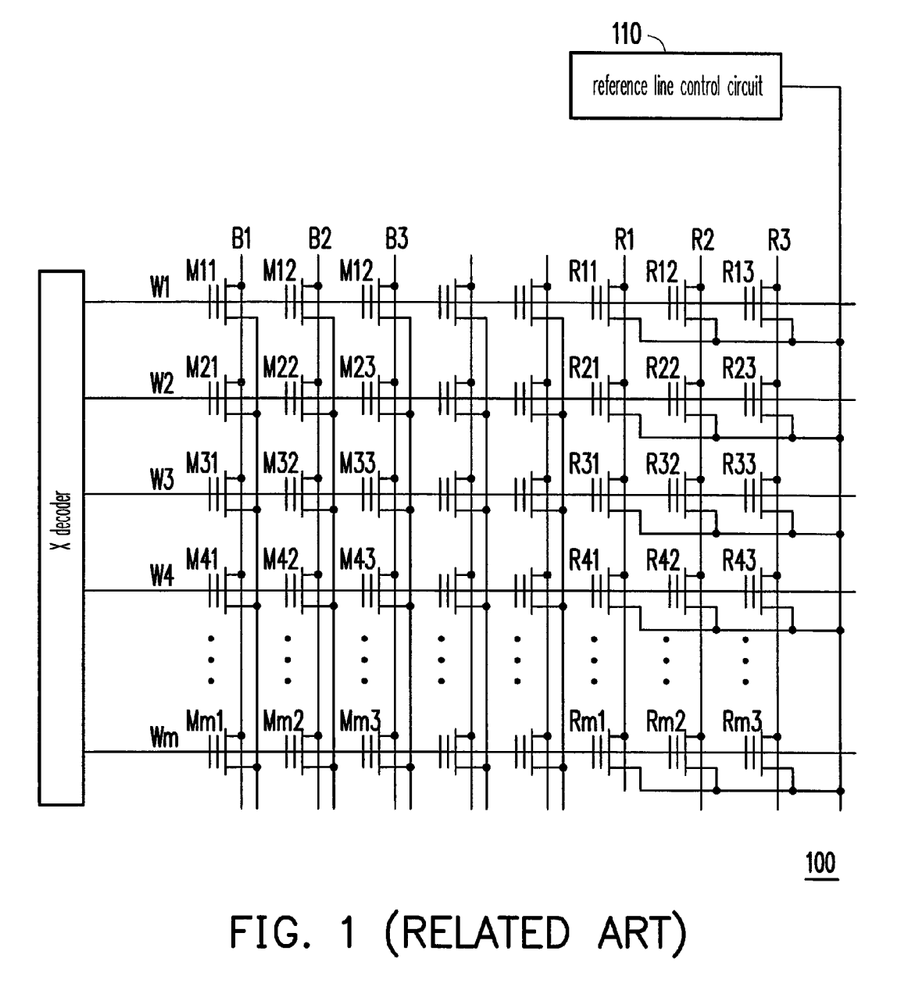
FIG. 1 is a circuit of a prior art flash memory apparatus 100

Please refer to FIG. 1, FIG. 1 is a circuit of a prior art flash memory apparatus 100. The flash memory apparatus 100 includes a reference line control circuit 110, a X decoder 120, a plurality of memory cells M11-Mm3, and a plurality of reference cells R11-Rm3. The X decoder 120 coupled to the memory cells M11-Mm3 and the reference cells R11-Rm3. The X decoder 120 generates and provides the word lines signals W1-Wm to the memory cells M11-Mm3 and the reference cells R11-Rm3, respectively. The memory cells M11-Mm1, M12-Mm2 and M13-Mm3 coupled to bit lines B1, B2 are B3 respectively, and the reference cells R11-Rm1, R12-Rm2 and R13-Rm3 coupled to the reference bit lines R1, R2 and R3 respectively. The reference line control circuit 110 coupled to the reference cells R11-Rm3 and sources of the reference cells R11-Rm3 are grounded or floated by the reference line control circuit 110. The flash memory apparatus 100 compares the currents from one of the bit lines B1-B3 and one of reference bit lines R1-R3 to generate a data output of the flash memory apparatus 100.

SUMMARY OF THE INVENTION

The present invention provides a plurality of flash memory apparatuses for increasing the efficient of the sense amplifying module of the flash memory.

The present invention provides a flash memory apparatus comprising at least one flash memory array block and a sense amplifying module. The flash memory array block comprises N storage columns, N reference word-line cell units and a reference storage column. Each of the storage column comprises a plurality of memory cells coupled in serial, each of the memory cells coupled to a word line and a bit line, wherein N is a positive integer. Each of the reference word-line cell units disposed in each of the storage columns, and each of the reference word-line cell units coupled to the memory cells in the corresponding storage column, wherein, the reference word-line cell units further coupled to a reference word line and a dummy word line. The reference storage column is disposed neighbor to the storage columns, the reference storage column comprises a plurality of reference bit-line cells coupled in serial, the reference bit-line cells coupled to the word lines, the reference word line and the dummy word line, one of the reference bit-line cells which coupled to the reference word line is coupled to a reference bit line. The sense amplifying module compares currents from one of the bit lines and the corresponding reference bit line to generate at least one sensing result.

The present invention provides another flash memory apparatus comprising a plurality of flash memory array blocks and a sense amplifying module. Each of the flash memory array block comprises N storage columns, N reference word-line cell units and a first and a second reference storage columns. Each of the storage column comprises a plurality of memory cells coupled in serial, each of the memory cells coupled to a word line and a bit line, wherein N is a positive integer. Each of the reference word-line cell units disposed in each of the storage columns, and each of the reference word-line cell units coupled to the memory cells in the corresponding storage column, wherein, the reference word-line cell units further coupled to a first and a second reference word lines. The first and the second reference storage columns are disposed neighbor to the storage columns, each of the first and the second reference storage columns comprise a plurality of reference bit-line cells coupled in serial, the reference bit-line cells in the first reference storage column coupled to the word lines and the first reference word line respectively, the reference bit-line cells in the second reference storage column coupled to the word lines and the second reference word line respectively, one of the reference bit-line cells of the first and second reference storage columns which coupled to the first and the second reference word lines are coupled to a first and a second reference bit lines respectively. The sense amplifying module compares currents from one of the bit lines and/or the corresponding first and second reference bit lines to generate at least one sensing result.

Accordingly, the present application provides at least one reference storage column for generating at least one reference current to the reference bit line. The sense amplifying module generates at least one sensing result by comparing currents from one of the bit lines and the corresponding reference bit line. That is, the current on the reference bit line is varied according to the process variation of the flash memory apparatus. It is not necessary to set a wide reference current range for the sense amplifying module of the flash memory apparatus disclosed by present application, the performance is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiment of the invention, examples of which are illustrated in the accompanying drawings. Wherever possible, the same reference numbers are used in the drawings and the description to refer to the same or like parts.

Figure 2:
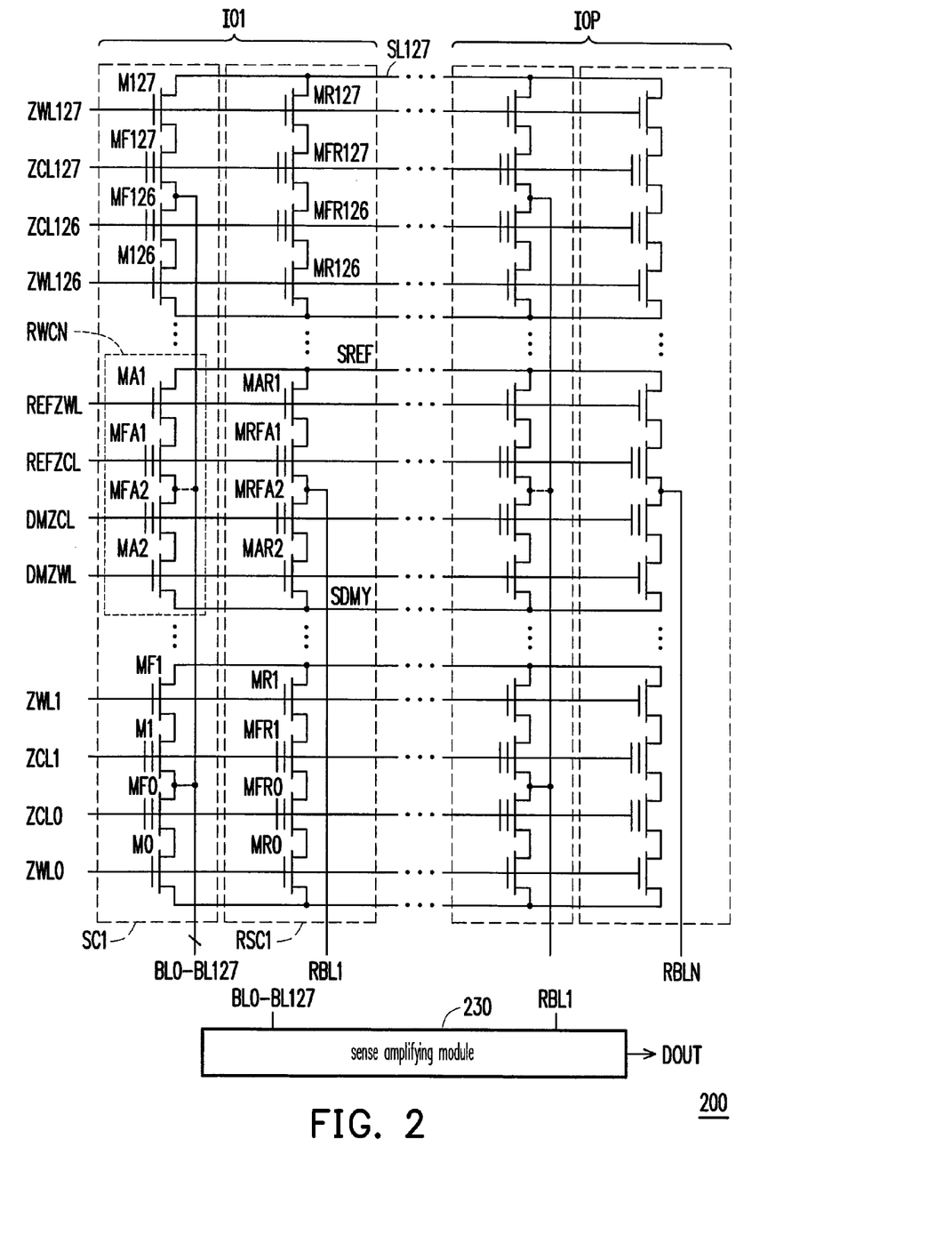
FIG. 2 is a circuit diagram of a flash memory apparatus 200 according to an embodiment of the present invention.

Referring to FIG. 2, FIG. 2 is a circuit diagram of a flash memory apparatus 200 according to an embodiment of the present invention. The flash memory apparatus 200 includes at least one flash memory array block(s) IO1-IOP and a sense amplifying module 230. Each of the flash memory array blocks, for example the flash memory array block IO1, includes N storage columns SC1, N reference word-line cell units RWCN and a reference storage column RSC1, wherein N is a positive integer (N is equal to 1 in FIG. 2). The storage column SC1 includes a plurality of memory cells is coupled in serial, and the memory cells are coupled to word lines ZWL0-ZWL127 respectively and the memory cells are also coupled to bit lines BL0-BL127 respectively. Please notice here, the storage column SC1 includes a plurality of transistors M0-M127 and nonvolatile memory (NVM) transistors MF0-MF127. Each of the transistors M0-M127 and each of the NVM transistors MF0-MF127 are arranged in the storage columns SC1 alternatively, and one of the transistors M0-M127 and one of the NVM transistors MF0-MF127 which arranged together forms a memory cell. For example, the transistor M127 and the NVM transistor MF127 forms one of the memory cell in the storage columns SC1.

The gate of the transistors M0-M127 coupled to word lines ZWL0-ZWL127 respectively in a chip where the flash memory apparatus 200 embedded in. Also, the control end of the NVM transistors are coupled to control lines ZCL0-ZCL127 respectively. Furthermore, reference word-line cell units RWCN is disposed in the storage column SC1, and the reference word-line cell unit RWCN coupled to the memory cells in the corresponding storage column SC1, wherein, the reference word-line cell unit RWCN further coupled to a reference word line REFZWL and a dummy word line DMZWL.

For example, in the memory cell with transistor M127 and NVM transistor MF127, the first end of the transistor M127 is coupled to a source line SL127, the control end is coupled to the word line ZWL127, and the second end of the transistor M127 is coupled to the first end of the NVM transistor MF127. The control end of the NVM transistor MF127 is coupled to the control line ZC127 and the second end of the NVM transistor MF127 is coupled to a bit line BL127 and the NVM transistor MF126 of next memory cell.

In the present embodiment, the reference word-line cell unit RWCN includes a reference transistor MA1, a dummy transistor MA2, a NVM transistor MFA1 and a dummy NVM transistor MFA2. The first end of the reference transistor MA1 is coupled to a source line SREF, the control end of the reference transistor MA1 is coupled to a reference word line REFZWL, and the second end of the reference transistor MA1 is coupled to the first end of the reference NVM transistor MFA1. The control end of the reference NVM transistor MFA1 is coupled to a reference control line REFZCL, and the second end of the reference NVM transistor MFA1 is coupled to the first end of the dummy NVM transistor MFA2. Moreover, the control end of the dummy NVM transistor MFA2 is coupled to a dummy control line DMZCL, and the second end of the dummy NVM transistor MFA2 is coupled to the first end of the dummy transistor MA2. The control end of the dummy transistor MA2 is coupled to a dummy word line DMZWL, and the second end of the dummy transistor MA2 is coupled to a dummy source line SDMY.

For some embodiments, the bit lines BL0-BL127 also can be coupled to the coupled terminal of the reference NVM transistor MFA1 and the dummy NVM transistor MFA2.

On the other hand, the reference storage column RSC1 is disposed neighbor to the storage column SC. The reference storage column RSC1 includes a plurality of reference bit-line cells coupled in serial. The reference bit-line cells are coupled to the word lines ZWL0-ZWL127, the reference word line REFZWL and the dummy word line DMZWL. One of the reference bit-line cells which coupled to the reference word line REFZWL is coupled to a reference bit line RBL1.

The reference storage column RSC1 includes a plurality of bit-line reference transistors MR0-MR127 and MAR1-MAR2 and bit-line reference NVM transistors MRF0-MRF127 and MRFA1-MRFA2. Each of the reference bit-line cells in the reference storage column RSC1 is formed by each of the bit-line reference transistors MR0-MR127 and MAR1-MAR2 and the corresponding bit-line reference NVM transistor. For example, in the FIG. 2, the bit-line reference transistors MR0 and the bit-line reference NVM transistors MRF0 form one of the reference bit-line cells in the reference storage column RSC1.

In the reference storage column RSC1, a reference bit line RBL1 is coupled to the reference bit-line cell which coupled to the reference word line REFZWL. That is, the reference bit-line cell including the bit-line reference NVM transistor MRFA1 and the bit-line reference transistor MAR1 coupled to the reference bit line RBL1. The reference bit line RBL1 is also coupled to the reference bit-line cell including the bit-line reference NVM transistor MRFA2 and the bit-line reference transistor MAR2 which are coupled to the dummy control line DMZWL and the dummy word line DMZCL respectively.

The sense amplifying module 230 is coupled to the bit lines BL0-BL127 and the reference bit line RBL1. The sense amplifying module 230 compares currents from one of the bit lines BL0-BL127 and the corresponding reference bit line RBL1 to generate at least one sensing result DOUT.

In an embodiment, when the flash memory apparatus operated in a data read mode, a voltage level on the reference control line REFZCL can be set to 2.0V, and the voltages level on the control lines ZCL0-ZCL127 can be set to 2.8V. Accordingly, a current on the reference bit line RBL1 is generated, and the current level may be equal to 10 uA. The data read out from each of the memory cells in the flash memory array block IO1 can be determined by comparing a current on each of the bit lines BL0-BL127 and the current on the reference bit line RBL1. For example, if the current on the bit line BL0 is larger than the current on the reference bit line RBL1, the data stored in the memory cell composed by transistors M127 and MF127 is logical "0". On the contrary, if the current on the bit lines BL0 is smaller than the current on the reference bit line RBL1, the data stored in the memory cell composed by transistors M127 and MF127 is logical "1".

When the flash memory apparatus operated in a program mode, a high voltage is provided to the memory cell which is selected to be programmed. The reference control line REFZCL can be set to 2.0 V, and the voltage level on the control line ZCL0 can be set to 4.3 V. Whether the program mode is complete or not can be decided by comparing the current on the bit line BL0 and the current on the reference bit line RBL1. That is, when the current on the bit line BL0 is smaller than the current the reference bit line RBL1, the program mode should be continued, and when the current on the bit line BL0 is larger than the current the reference bit line RBL1, the program mode have done.

When the flash memory apparatus operated in an erase mode, a high voltage is provided to at least one of the flash memory array blocks IO1-IOP. The voltage level on the reference control line REFZCL can be set to 2.0 V, and the voltages level on the control lines ZCL0-ZCL127 can be set to 2.0 V. Whether the erase mode is complete or not can be decided by comparing the current on each of the bit lines BL0-BL127 and the current on the reference bit line RBL1. That is, when the current on each of the bit lines BL0-BL127 is larger than the current the reference bit line RBL1, the erase mode should be continued, and when the current on the bit lines BL0-BL127 is smaller than the current the reference bit line RBL1, the erase mode have done.

In an embodiment, the dummy cell is hold in an eased state. That is, the dummy cell including the dummy transistor MA2 and the dummy NVM transistor MFA2 is hold in the eased state. In an embodiment, both of the dummy cell and the reference cell can be turned on by the signals on the dummy word line DMZWL and the reference word line REFZWL respectively. When both of the dummy cell and the reference cell are turned on, a higher and stable erase current on the reference bit line BL1 can be obtained. For example, the current level on the reference bit line RBL1 can be doubled. Such as that, the sensing ability of the sense amplifying module 230 can be increased.

Figure 3:
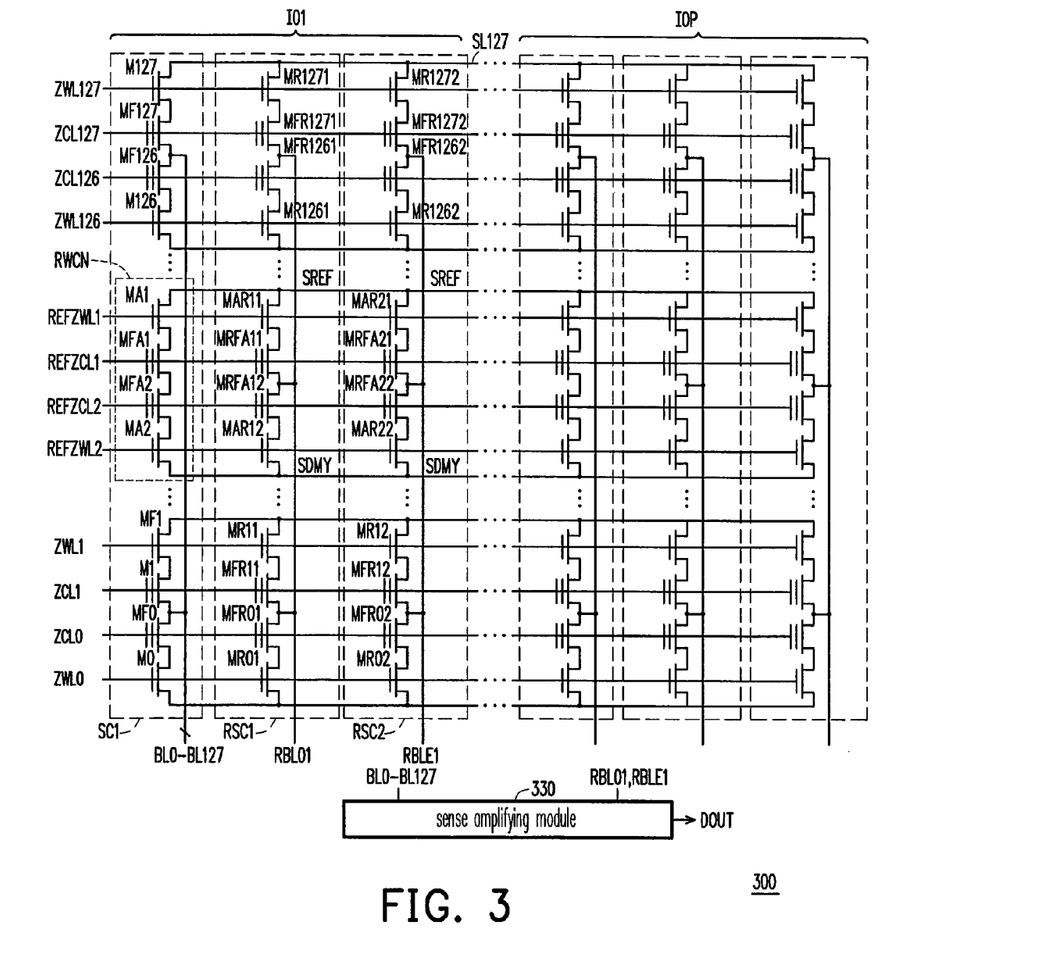
FIG. 3 is a circuit diagram of a flash memory apparatus 300 according to another embodiment of the present invention.

Please referring to FIG. 3, FIG. 3 is a circuit diagram of a flash memory apparatus 300 according to another embodiment of the present invention. The flash memory apparatus 300 includes a plurality of flash memory array blocks IO1-IOP, for example, the flash memory array blocks IO1 includes a storage column SC1, a reference word-line cell unit RWCN, a first and a second reference storage columns RSC1 and RSC2 and a sense amplifying module 330. The storage column SC1 includes a plurality of memory cells coupled in serial. The memory cells are coupled to the word lines ZWL0-ZWL127 and bit lines BL127-BL0. The reference word-line cell unit RWCN is disposed in each of the storage column SC1, and the reference word-line cell unit RWCN is coupled to the memory cells in the corresponding storage column SC1, wherein, the reference word-line cell unit RWCN is further coupled to a first and a second reference word lines REFZWL1 and REFZWL2. The first and the second reference storage columns RSC1 and RSC2 are disposed neighbor to the storage columns SC1. Each of the first and the second reference storage columns RSC1 and RSC2 includes a plurality of reference bit-line cells coupled in serial, the reference bit-line cells in the first reference storage column RSC1 are coupled to the word lines ZWL0-ZWL127 and the first reference word line REFZWL1 respectively. The reference bit-line cells in the second reference storage column RCS2 are coupled to the word lines ZWL0-ZWL127 and the second reference word line REFZWL2 respectively. One of the reference bit-line cells of the first and second reference storage columns RCS1 and RCS2 which coupled to the first and the second reference word lines REFZWL1 and REFZWL2 are coupled to a first and a second reference bit lines RBLO1 and RBLE1 respectively.

The first reference storage column RCS1 further includes a plurality of memory cells, and the memory cells are composed by transistors MR01-MR1271 and NVM transistors MFR01-MFR1271. The second reference storage column RCS2 further includes a plurality of memory cells, and the memory cells are composed by transistors MR02-MR1272 and NVM transistors MFR02-MFR1272.

Please notice here, the first reference storage column RCS1 includes reference transistors MAR11 and MAR12 and reference NVM transistors MRFA11 and MRFA12. The second reference storage columns RCS2 includes reference transistors MAR21 and MAR22 and reference NVM transistors MRFA21 and MRFA22. The connection end of the reference NVM transistors MRFA11 and MRFA12 further coupled to the first reference bit line RBLO1, and the connection end of the reference NVM transistors MRFA21 and MRFA22 further coupled to the second reference bit line RBLE1. The gates of the reference transistor MAR11 and the reference NVM transistor MRFA11 are coupled to the first reference word line REFZWL1 and first reference control line REFZCL1 respectively. The second reference word line REFZWL2 and second reference control line REFZCL2 are coupled to the gates of the reference transistor MAR12 and the reference NVM transistor MRFA12. On the contrary, the gates of the reference transistor MAR22 and the reference NVM transistor MRFA22 are coupled to the second reference word line REFZWL2 and second reference control line REFZCL2 respectively. The first reference word line REFZWL1 and first reference control line REFZCL1 are also coupled to the gates of the reference transistor MAR21 and the reference NVM transistor MRFA21, respectively.

The sense amplifying module 330 compares currents from one of the bit lines and the corresponding first and second reference bit lines RBLO1 and/or RBLE1 to generate at least one sensing result DOUT.

In this embodiment, the reference bit-line cells in one of the first and the second reference storage columns RSC1 and RSC2 are selected to connect to the sense amplifying module 330, and the other one of the first and the second reference storage columns RSC1 and RSC2 are isolated from the sense amplifying module 330. Wherein, the reference bit-line cells which are selected to connect to the sense amplifying module 330 are configured to be reference cells, and the reference bit-line cells which are isolated from the sense amplifying module 330 are configured to be dummy cells.

Figure 4:
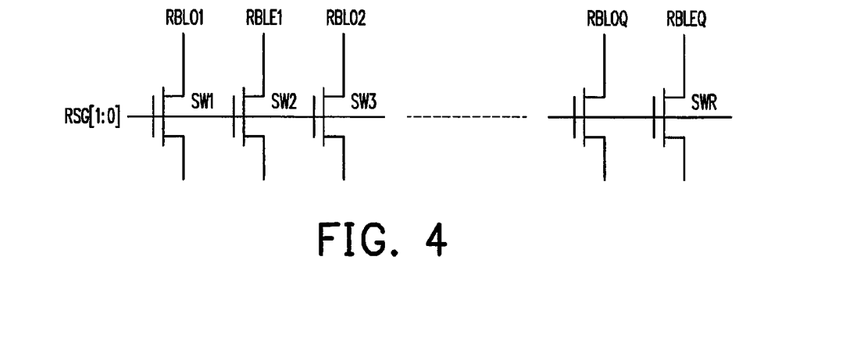
FIG. 4 is a circuit diagram of a plurality of selecting circuits.

Please referring to FIG. 3 and FIG. 4, wherein, FIG. 4 is a circuit diagram of a plurality of selecting circuits. The selecting circuits are formed by transistor switch SW1-SWR. The selecting circuits SW1-SWR are coupled between the flash memory array blocks IO1-IOP and the sense amplifying module 330. The selecting circuits SW1-SWR are controlled by a selecting gate control signal RSG[0:1], and each of the selecting circuits SW1-SWR decides to transport currents on the corresponding first and/or second reference bit lines RBLO1-RBLOQ and RBLE1-RBLEQ to the sense amplifying module 330 or not according to the selecting gate control signal RSG[0:1]. In this embodiment, the selecting gate control signal RSG[0:1] is a signal with two digital bits. One bit of the selecting gate control signal RSG[0:1] is used to control the selecting circuits SW1, SW3, . . . which are arranged in odd order of the selecting circuits SW1-SWR, and the other bit of the selecting gate control signal RSG[0:1] is used to control the selecting circuits SW2, SW4, . . . which are arranged in even order of the selecting circuits SW1-SWR.

For example, the selecting circuit SW1 is controlled by the selecting gate control signal RSG[0] and the selecting circuit SW2 is controlled by the selecting gate control signal RSG[1]. The turned on or turned off statuses of the selecting circuits SW1 and SW2 can be different or the same.

Figure 5A:
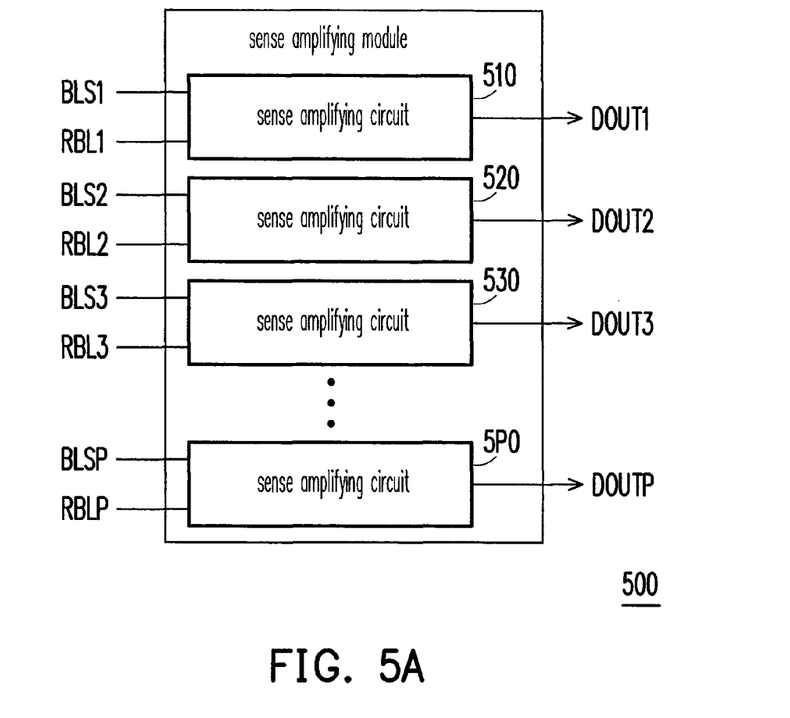
FIG. 5A is a block diagram of a sense amplifying module 500 according to an embodiment of the present invention.

Please referring to FIG. 5A, FIG. 5A is a block diagram of a sense amplifying module 500 according to an embodiment of the present invention. The sense amplifying module 500 includes one or more sense amplifying circuit(s) 510-5P0. Each of the sense amplifying circuits 510-5P0 is coupled to each of the flash memory array blocks IO1-IOP for receiving the currents from one of the bit lines and the reference bit line of corresponding flash memory array block. The sense amplifying circuits 510-5P0 receives and compares the currents from the selected bit lines BLS1-BLSP and the reference bit lines RBL1-RBLP respectively for generating sensing results DOUT1-DOUTP respectively.

Figure 5B:
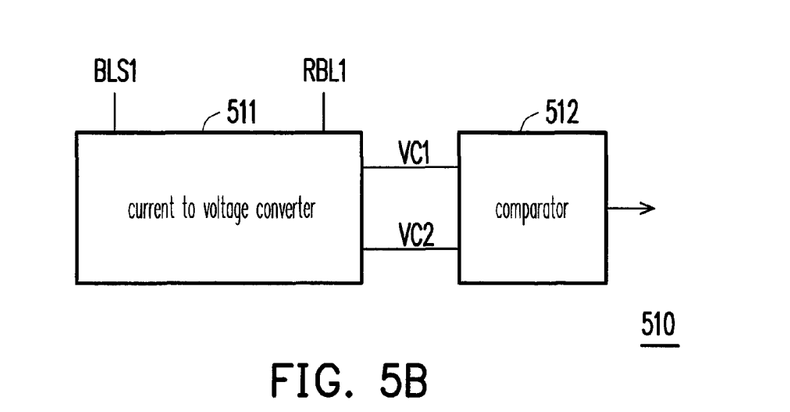
FIG. 5B is a block diagram of a sense amplifying circuit 510 according to an embodiment of the present invention.

Please referring to FIG. 5B, FIG. 5B is a block diagram of a sense amplifying circuit 510 according to an embodiment of the present invention. The sense amplifying circuit 510 includes a current to voltage converter 511 and a comparator 512. The current to voltage converter 511 receives the currents of the selected bit line BL1 and the reference bit line RBL1, and generates a first and a second compared voltages VC1 and VC2 according to the selected bit line BL1 and the reference bit line RBL1. The comparator 512 is coupled to the current to voltage converter 511. The comparator 512 receives and compares the first and the second compared voltages VC1 and VC2 for generating the sensing result DOUT1.

Figure 5C:
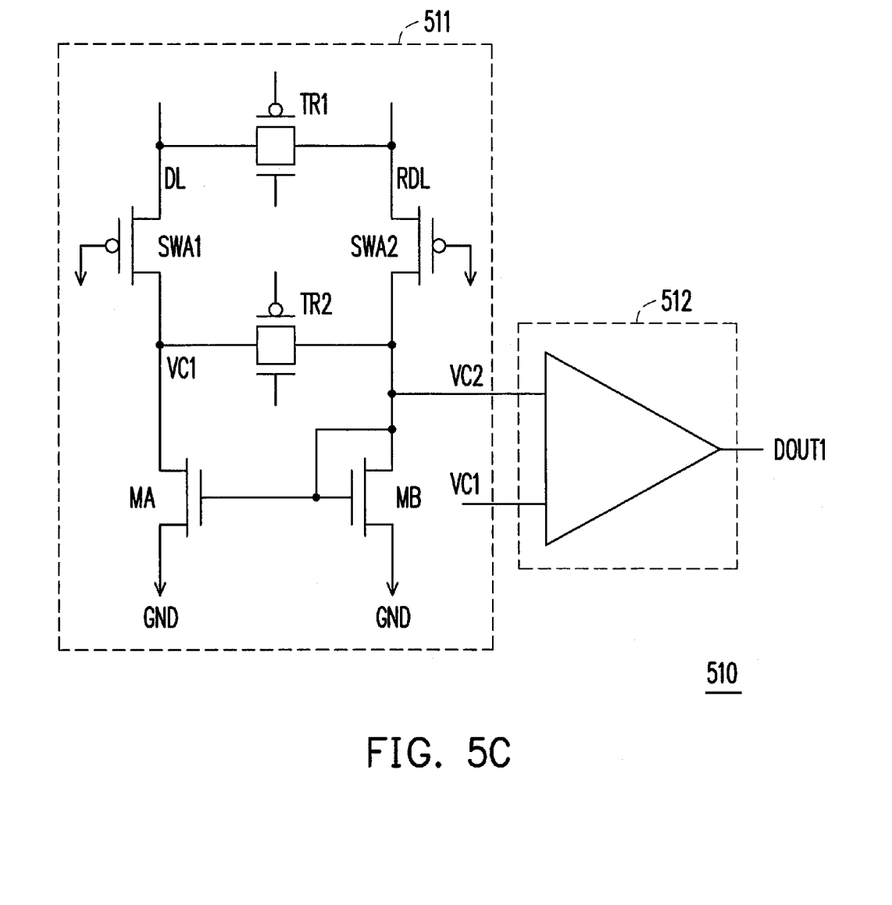
FIG. 5C is a circuit diagram of a sense amplifying circuit 510 according to an embodiment of the present invention.

Please referring to FIG. 5C, FIG. 5C is a circuit diagram of a sense amplifying circuit 510 according to an embodiment of the present invention. The current to voltage converter 511 includes transmission gates TR1 and TR2, transistor switches SWA1 and SWA2, transistor MA and transistor MB. The first end of the transistor MA receives the current of one of the bits lines from a data line DL, the second end of the transistor MA coupled to a reference ground voltage GND. The first end of the transistor MB receives the current of the reference bit line from a reference data line RDL, the second end of the transistor MB coupled to the reference ground voltage GND, and the control end of the transistor MB is coupled to the control end of the first transistor MA and the first end of the transistor MB.

The compared voltages VC1 and VC2 are generated on the first ends of the transistor MA and MB respectively. The compared voltages VC1 and VC2 are transported to the comparator 512. Additionally, the data line DL is coupled to one of the bits lines of corresponding flash memory array block, and the reference data line RDL is coupled to the reference bit line of corresponding flash memory array block. The transistor switch SWA1 is configured to turn on or off the connection between the data line DL and the transistor MA and the transistor switch SWA2 is configured to turn on or off the connection between the reference data line RDL and the transistor MB. The transmission gate TR1 is configured to equalize the data line DL and the reference data line RDL, and the transmission gate TR1 is configured to equalize the first ends of the transistors MA and MB.

Figure 5D:
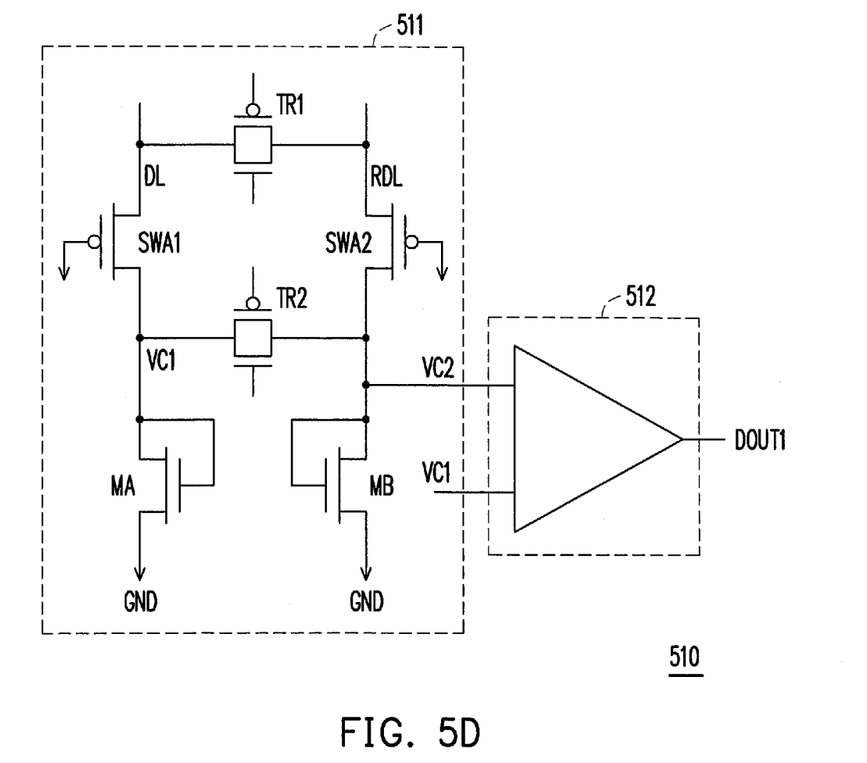
FIG. 5D is another circuit diagram of a sense amplifying circuit 510 according to an embodiment of the present invention.

Please referring to FIG. 5D, FIG. 5D is another circuit diagram of a sense amplifying circuit 510 according to an embodiment of the present invention. In this embodiment, the connection relationship of the transistor MA and MB is different form the embodiment of FIG. 5C. In FIG. 5D, the transistor MA and MB are configured to be diode connection transistors respectively. That is, the first end and control end of the transistor MA are connected together, and the first end and control end of the transistor MB are connected together. The cathodes of the diodes formed by transistor MA and MB coupled to the reference ground GND, the anodes of the diodes formed by transistor MA and MB generates the first and second compared voltage VC1 and VC2 respectively.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A flash memory apparatus, comprising:
   at least one flash memory array block, the flash memory array block comprises:
   N storage columns, each of the storage column comprises a plurality of memory cells coupled in serial, each of the memory cells coupled to a word line, a control line and a bit line, wherein N is a positive integer;
   N reference word-line cell units, each of the reference word-line cell units disposed in each of the storage columns and located in a central portion of the flash memory array block, and each of the reference word-line cell units coupled to the memory cells in the corresponding storage column, wherein, the reference word-line cell units further coupled to a reference word line, a reference control line and a dummy word line; and
   a reference storage column, the reference storage column is disposed neighbor to the storage columns, the reference storage column comprises a plurality of reference bit-line cells coupled in serial, the reference bit-line cells coupled to the word lines, the reference word line and the dummy word line, one of the reference bit-line cells which coupled to the reference word line is coupled to a reference bit line,
   wherein when a control circuit is configured to control the flash memory apparatus to operate in a data read mode, a voltage level on the reference control line is a first voltage, and the first voltage is different from a second voltage on each control line of the N storage columns, wherein a current level on the reference bit line is between a logical "0" current level and a logical "1" current level; and
   a sense amplifying module, the sense amplifying module compares currents from one of the bit lines and the corresponding reference bit line to generate at least one sensing result.

2. The flash memory apparatus according to claim 1, wherein each of the reference word-line cell units comprises:
   a reference cell, coupled to one of the memory cells and coupled to the reference word line; and
   a dummy cell, coupled to the reference cell and another one of the memory cells, and the dummy cell coupled to the dummy word line.

3. The flash memory apparatus according to claim 2, wherein the reference cell comprises:
   a reference transistor, having a first end, a second end and a control end, the first end coupled to a reference source line, the control end coupled to the reference word line; and
   a reference nonvolatile memory (NVM) transistor, having a first end, a second end and a control end, the first end coupled to the second end of the reference transistor, the control end of the reference NVM transistor coupled to a reference control line, and the second end of the reference NVM transistor coupled to the corresponding dummy cell.

4. The flash memory apparatus according to claim 2, wherein the dummy cell comprises:
   a dummy NVM transistor, having a first end, a second end and a control end, the first end of the dummy NVM transistor coupled to the second end of the reference NVM transistor, the control end of the dummy NVM transistor coupled to a dummy control line; and
   a dummy transistor, having a first end, a second end and a control end, the first end of the dummy transistor coupled to the second end of the dummy NVM transistor, the second end of the dummy transistor coupled to a dummy source line, and the control end of the dummy transistor coupled to the dummy word line.

5. The flash memory apparatus according to claim 2, wherein the dummy cell is hold in an erase state.

6. The flash memory apparatus according to claim 2, wherein when the reference cell is in an erase state, the first voltage is smaller than the second voltage.

7. The flash memory apparatus according to claim 1, wherein each of the memory cells comprises:

a transistor, having a first end, a second end and a control end, the first end of the transistor coupled to a source line, and the control end coupled to the corresponding word line; and a NVM transistor, having a first end, a second end and a control end, the first end of the NVM transistor coupled to the second end of the transistor, the control end of the transistor coupled to a control line, the second end of the NVM transistor coupled to the corresponding bit line.

8. The flash memory apparatus according to claim 1, wherein the sense amplifying module comprises:

at least one sense amplifying circuit, the sense amplifying circuit comprises:
- a current to voltage converter, receives the currents of one of the bits lines and the reference bit line, and the current to voltage converter generates a first and a second compared voltages according to the currents of one of the bits lines and the reference bit line respectively; and
- a comparator, coupled to the current to voltage converter, the comparator receives and compares the first and the second compared voltages for generating the sensing result.

9. The flash memory apparatus according to claim 8, wherein the current to voltage converter comprises:

a first transistor, having a first end, a second end and a control end, the first end of the first transistor receives the current of one of the bits lines, the second end of the first transistor coupled to a reference ground voltage; and a second transistor, having a first end, a second end and a control end, the first end of the second transistor receives the current of the reference bit line, the second end of the second transistor coupled to a reference ground voltage, and the control end of the second transistor is coupled to the control end of the first transistor and the first end of the second transistor, wherein, the first and the second compared voltages are generated on the first ends of the first and the second transistors respectively.

10. The flash memory apparatus according to claim 8, wherein the current to voltage converter comprises:

a first diode, an anode of the first diode receives the current of one of the bits lines, the cathode of the first diode coupled to a reference ground voltage; and a second diode, an anode of the second diode receives the current of the reference bit line, the cathode of the second diode coupled to the reference ground voltage, wherein, the first and the second compared voltages are generated on the anodes of the first diode and the second diode respectively.

11. The flash memory apparatus according to claim 10, wherein the first diode is a first diode connected transistor, the second diode is a second diode connected transistor.

12. The flash memory apparatus according to claim 1, wherein after a selected memory cell of the flash memory apparatus is operated in a program mode, when the voltage level on the reference control line is the first voltage, the voltage level on the selected control line is a third voltage, and the third voltage is larger than the second voltage, whether the program mode is completed or not is decided by a difference between the third voltage and the first voltage.

13. The flash memory apparatus according to claim 1, wherein after the flash memory apparatus is operated in an erase mode, when the voltage level on the reference control line is the first voltage, the voltage level on each control line of the N storage column is a fourth voltage, and the fourth voltage is smaller than the second voltage, whether the erase mode is completed or not is decided by a difference between the fourth voltage and the first voltage.

14. A flash memory apparatus, comprising:

a plurality of flash memory array blocks, each of the flash memory array block comprises:

N storage columns, each of the storage column comprises a plurality of memory cells coupled in serial, each of the memory cells coupled to a word line and a bit line, wherein N is a positive integer;

N reference word-line cell units, each of the reference word-line cell units disposed in each of the storage columns and located in a central portion of the flash memory array block, and each of the reference word-line cell units coupled to the memory cells in the corresponding storage column, wherein, the reference word-line cell units further coupled to a first and a second reference word lines; and a first and a second reference storage columns, the first and the second reference storage columns are disposed neighbor to the storage columns, each of the first and the second reference storage columns comprises a plurality of reference bit-line cells coupled in serial, the reference bit-line cells in the first reference storage column coupled to the word lines and the first reference word line respectively, the reference bit-line cells in the second reference storage column coupled to the word lines and the second reference word line respectively, one of the reference bit-line cells of the first and second reference storage columns which coupled to the first and the second reference word lines are coupled to a first and a second reference bit lines respectively;

a sense amplifying module, the sense amplifying module compares currents from one of the bit lines and the corresponding first and/or second reference bit lines to generate at least one sensing result; and a plurality of selecting circuits, the selecting circuits coupled between the flash memory array blocks and the sense amplifying module and controlled by a selecting gate control signal from a control circuit, each of the selecting circuits configured to decide to transport currents on the corresponding first and/or second reference bit lines to the sense amplifying module or not according to the selecting gate control signal.

15. The flash memory apparatus according to claim 14, wherein each of the reference word-line cell units comprises:

a reference cell, coupled to one of the memory cells and coupled to the reference word line; and a dummy cell, coupled to the reference cell and another one of the memory cells, and the dummy cell coupled to the dummy word line.

16. The flash memory apparatus according to claim 15, wherein the reference cell comprises:

a reference transistor, having a first end, a second end and a control end, the first end coupled to a reference source line, the control end coupled to the first reference word line; and a reference NVM transistor, having a first end, a second end and a control end, the first end coupled to the second end of the reference transistor, the control end of the reference NVM transistor coupled to a reference control line, and the second end of the reference NVM transistor coupled to the corresponding dummy cell.

17. The flash memory apparatus according to claim 15, wherein the dummy cell comprises:

a dummy NVM transistor, having a first end, a second end and a control end, the first end of the dummy NVM transistor coupled to the second end of the reference NVM transistor, the control end of the dummy NVM transistor coupled to a dummy control line; and a dummy transistor, having a first end, a second end and a control end, the first end of the dummy transistor coupled to the second end of the dummy NVM transistor, the second end of the dummy transistor coupled to a dummy source line, and the control end of the dummy transistor coupled to the second reference word line.

18. The flash memory apparatus according to claim 14, wherein each of the memory cells comprises:

a transistor, having a first end, a second end and a control end, the first end of the transistor coupled to a source line, and the control end coupled to the corresponding word line; and a NVM transistor, having a first end, a second end and a control end, the first end of the NVM transistor coupled to the second end of the transistor, the control end of the transistor coupled to a control line, the second end of the NVM transistor coupled to the corresponding bit line.

19. The flash memory apparatus according to claim 14, wherein the sense amplifying module comprises:

at least one sense amplifying circuit, the sense amplifying circuit comprises:

a current to voltage converter, receives the currents of one of the bits lines and at least one of the first and second reference bit lines, and the current to voltage converter respectively generates a first and a second compared voltages according to the currents of one of the bits lines and the current of at least one of the first and the second reference bit lines; and a comparator, coupled to the current to voltage converter, the comparator receives and compares the first and the second compared voltages for generating the sensing result.

20. The flash memory apparatus according to claim 19, wherein the current to voltage converter comprises:

a first transistor, having a first end, a second end and a control end, the first end of the first transistor receives the current of one of the bits lines, the second end of the first transistor coupled to a reference ground voltage; and a second transistor, having a first end, a second end and a control end, the first end of the second transistor receives the current of at least one of the first and the second reference bit lines, the second end of the second transistor coupled to a reference ground voltage, and the control end of the second transistor is coupled to the control end of the first transistor and the first end of the second transistor, wherein, the first and the second compared voltages are generated on the first ends of the first and the second transistors respectively.

21. The flash memory apparatus according to claim 19, wherein the current to voltage converter comprises:

a first diode, an anode of the first diode receives the current of one of the bits lines, the cathode of the first diode coupled to a reference ground voltage; and a second diode, an anode of the second diode receives the current of at least one of the first and the second reference bit lines, the cathode of the second diode coupled to the reference ground voltage, wherein, the first and the second compared voltages are generated on the anodes of the first diode and the second diode respectively.

* * * * *